(12) United States Patent
Zhang et al.

(10) Patent No.: US 9,248,544 B2
(45) Date of Patent: Feb. 2, 2016

(54) ENDPOINT DETECTION DURING POLISHING USING INTEGRATED DIFFERENTIAL INTENSITY

(75) Inventors: Jimin Zhang, San Jose, CA (US);
Harry Q. Lee, Lost Altos, CA (US);
Zhihong Wang, Santa Clara, CA (US);
Wen-Chiang Tu, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 853 days.

(21) Appl. No.: 13/552,317

(22) Filed: Jul. 18, 2012

(65) Prior Publication Data

US 2014/0024291 A1 Jan. 23, 2014

(51) Int. Cl.
*B24B 37/013* (2012.01)
*B24B 37/04* (2012.01)
*H01L 21/66* (2006.01)
*B24B 49/12* (2006.01)
*B24B 37/10* (2012.01)

(52) U.S. Cl.
CPC ............. *B24B 37/013* (2013.01); *B24B 37/042* (2013.01); *B24B 37/105* (2013.01); *B24B 49/12* (2013.01); *H01L 22/12* (2013.01); *H01L 22/26* (2013.01)

(58) Field of Classification Search
CPC .... B24B 37/013; B24B 49/12; B24B 37/042; H01L 22/12; H01L 22/26
USPC .......................................... 451/5, 6; 256/630
See application file for complete search history.

(56) References Cited

U.S. PATENT DOCUMENTS

| | | | | |
|---|---|---|---|---|
| 5,294,289 A * | 3/1994 | Heinz | ................... | B24B 37/013 118/712 |
| 6,361,646 B1 | 3/2002 | Bibby, Jr. et al. | | |
| 6,491,569 B2 * | 12/2002 | Bibby, Jr. | ............. | B24B 37/013 451/5 |
| 6,618,130 B2 * | 9/2003 | Chen | ...................... | B24B 37/013 257/E21.23 |
| 6,676,482 B2 | 1/2004 | Bibby, Jr. et al. | | |
| 6,690,473 B1 * | 2/2004 | Stanke | ..................... | B24B 37/34 257/E21.53 |
| 6,785,010 B2 * | 8/2004 | Kimba | ...................... | B08B 1/04 356/630 |
| 6,798,529 B2 * | 9/2004 | Saka | ..................... | B24B 37/013 356/630 |
| 6,829,054 B2 * | 12/2004 | Stanke | ................... | B24B 37/34 257/E21.53 |
| 6,832,947 B2 * | 12/2004 | Manning | ............... | B24B 37/013 451/286 |
| 6,930,782 B1 * | 8/2005 | Yi | .......................... | B24B 21/04 356/504 |
| 7,049,156 B2 * | 5/2006 | Kueny | ............... | G01B 11/0625 257/E21.53 |
| 7,072,050 B2 * | 7/2006 | Kimba | ...................... | B08B 1/04 356/630 |
| 7,151,609 B2 * | 12/2006 | Chalmers | ........... | G01B 11/0625 356/326 |
| 7,428,064 B2 * | 9/2008 | Kimba | ...................... | B08B 1/04 356/630 |
| 7,561,258 B2 * | 7/2009 | Xu | .......................... | H01L 22/26 356/72 |
| 7,675,634 B2 * | 3/2010 | Kimba | ...................... | B08B 1/04 356/630 |
| 7,981,309 B2 * | 7/2011 | Ueda | ..................... | B24B 37/013 216/84 |
| 2001/0039064 A1 | 11/2001 | Ushio et al. | | |
| 2005/0174583 A1 * | 8/2005 | Chalmers | ........... | G01B 11/0625 356/630 |
| 2005/0174584 A1 * | 8/2005 | Chalmers | ........... | G01B 11/0625 356/630 |

(Continued)

*Primary Examiner* — Lee D Wilson
*Assistant Examiner* — Jamal Daniel
(74) *Attorney, Agent, or Firm* — Fish & Richardson P.C.

(57) ABSTRACT

A method of controlling a polishing operation includes polishing a substrate, during polishing obtaining a sequence over time of measured spectra from the substrate with an in-situ optical monitoring system, for each measured spectrum from the sequence of measured spectra determining a difference between the measured spectrum and an immediate previous spectrum from the sequence, accumulating the difference for each measured spectrum to generate a total difference, comparing the total difference to a threshold, and detecting a polishing endpoint based on the comparison of the total difference to the threshold.

15 Claims, 3 Drawing Sheets

(56) References Cited

U.S. PATENT DOCUMENTS

| | | | |
|---|---|---|---|
| 2007/0039925 A1* | 2/2007 | Swedek | B24B 37/013 216/84 |
| 2007/0042675 A1 | 2/2007 | Benvegnu et al. | |
| 2007/0218812 A1* | 9/2007 | Benvegnu | B24B 37/013 451/56 |
| 2007/0224915 A1 | 9/2007 | David et al. | |
| 2008/0099443 A1 | 5/2008 | Benvegnu et al. | |
| 2008/0206993 A1* | 8/2008 | Lee | B24B 37/013 438/692 |
| 2010/0035519 A1* | 2/2010 | Benvegnu | B24B 37/013 451/6 |
| 2010/0056023 A1* | 3/2010 | David | B24B 37/005 451/5 |
| 2010/0284007 A1* | 11/2010 | Benvegnu | B24B 37/013 356/388 |
| 2011/0209412 A1* | 9/2011 | Benvegnu | B24B 37/013 51/297 |
| 2011/0301847 A1* | 12/2011 | David | B24B 37/013 702/1 |
| 2012/0021672 A1 | 1/2012 | David et al. | |
| 2012/0026492 A1* | 2/2012 | Zhang | B24B 37/013 356/300 |
| 2012/0053717 A1* | 3/2012 | Duboust | B24B 37/013 700/100 |
| 2012/0096006 A1* | 4/2012 | David | H01L 22/12 707/741 |
| 2012/0100642 A1* | 4/2012 | Swedek | B24B 37/013 438/16 |
| 2012/0231701 A1* | 9/2012 | Qian | B24B 49/12 451/5 |
| 2012/0268738 A1* | 10/2012 | David | B24B 37/013 356/326 |
| 2012/0274932 A1* | 11/2012 | David | B24B 37/013 356/300 |
| 2012/0276814 A1* | 11/2012 | Zhang | B24B 37/013 451/5 |
| 2012/0276815 A1* | 11/2012 | David | B24B 37/013 451/5 |
| 2012/0277897 A1* | 11/2012 | Zhang | B24B 37/005 700/103 |
| 2012/0278028 A1* | 11/2012 | David | B24B 37/013 702/127 |
| 2012/0289124 A1* | 11/2012 | Benvegnu | B24B 49/12 451/6 |
| 2012/0323355 A1* | 12/2012 | David | B24B 37/013 700/109 |
| 2013/0109112 A1* | 5/2013 | Grimbergen | G03F 1/80 438/16 |
| 2013/0237128 A1* | 9/2013 | David | B24B 49/12 451/5 |
| 2013/0273812 A1* | 10/2013 | Qian | B24B 49/12 451/5 |
| 2013/0273813 A1* | 10/2013 | Prasad | B24B 37/24 451/6 |
| 2013/0288570 A1* | 10/2013 | David | B24B 37/013 451/5 |
| 2014/0113524 A1* | 4/2014 | Qian | B24B 49/12 451/5 |
| 2014/0134758 A1* | 5/2014 | Shrestha | B24B 37/013 438/7 |
| 2014/0242730 A1* | 8/2014 | David | G01B 11/0625 438/8 |
| 2014/0242881 A1* | 8/2014 | David | B24B 49/12 451/5 |
| 2014/0273749 A1* | 9/2014 | Qian | B24B 37/005 451/5 |
| 2014/0316550 A1* | 10/2014 | Swedek | B24B 37/013 451/5 |
| 2015/0024659 A1* | 1/2015 | David | B24B 37/013 451/5 |

\* cited by examiner

ENDPOINT DETECTION DURING POLISHING USING INTEGRATED DIFFERENTIAL INTENSITY

TECHNICAL FIELD

The present disclosure relates to optical monitoring during chemical mechanical polishing of substrates.

BACKGROUND

An integrated circuit is typically formed on a substrate by the sequential deposition of conductive, semiconductive, or insulative layers on a silicon wafer. A variety of fabrication processes require planarization of a layer on the substrate. For example, for certain applications, e.g., polishing of a metal layer to form vias, plugs, and lines in the trenches of a patterned layer, an overlying layer is planarized until the top surface of a patterned layer is exposed. In other applications, e.g., planarization of a dielectric layer for photolithography, an overlying layer is polished until a desired thickness remains over the underlying layer.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. Abrasive polishing slurry is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry distribution, the polishing pad condition, the relative speed between the polishing pad and the substrate, and the load on the substrate can cause variations in the material removal rate. These variations, as well as variations in the initial thickness of the substrate layer, cause variations in the time needed to reach the polishing endpoint. Therefore, determining the polishing endpoint merely as a function of polishing time can lead to within-wafer non-uniformity (WIWNU) and wafer-to-wafer non-uniformity (WTWNU).

In some systems, a substrate is optically monitored in-situ during polishing, e.g., through a window in the polishing pad. However, existing optical monitoring techniques may not satisfy increasing demands of semiconductor device manufacturers.

SUMMARY

A substrate being polished typically includes an overlying layer to be polished and an underlying layer. One approach to optical monitoring is to measure a spectrum of light reflected from the substrate being polished, and find a best matching reference spectrum from a library of reference spectra. A value associated with the reference spectrum can be used for the endpoint control. Although this technique works well where there are small substrate-to-substrate variations in the thickness of the underlying layer, in some manufacturing environments there are large substrate-to-substrate variations in the thickness of the underlying layer. These variations lead to uncertainty or reduced reliability in the predicted endpoint. One approach to optical monitoring that may be able to reliably detect the polishing endpoint is to sum the spectrum-to-spectrum difference in intensity, and determine the endpoint based on the sum reaching a threshold value.

In one aspect, a method of controlling a polishing operation includes polishing a substrate, during polishing obtaining a sequence over time of measured spectra from the substrate with an in-situ optical monitoring system, for each measured spectrum from the sequence of measured spectra determining a difference between the measured spectrum and an immediate previous spectrum from the sequence, accumulating the difference for each measured spectrum to generate a total difference, comparing the total difference to a threshold, and detecting a polishing endpoint based on the comparison of the total difference to the threshold.

Implementations can include on or more of the following features. Obtaining the sequence may include scanning a sensor of the optical monitoring system across the substrate. Obtaining the sequence may include generating one measured spectrum per scan of the sensor across the substrate. Polishing the substrate may include rotating a platen that supports the sensor, and one measured spectrum may be generated per rotation of the platen. The in-situ monitoring system may generate a plurality of raw spectra per scan of the sensor across the substrate. Generating the one measured spectrum per scan may include combining at least some of the plurality of raw spectra. Combining at least some of the plurality of raw spectra may include averaging the at least some of the plurality of raw spectra. Generating the one measured spectrum per scan may include selecting a raw spectrum from at least some of the plurality of raw spectra. Determining the difference may include calculating a sum of squared differences between the measured spectrum and the immediate previous spectrum. Determining the difference may include calculating a sum of absolute differences between the measured spectrum and the immediate previous spectrum. Obtaining the sequence of measured spectra may include directing a beam of light onto the substrate and measuring a spectrum of a reflection of the beam. Accumulating the difference may include summing the difference. Detecting the polishing endpoint may include halting polishing if the total difference exceeds the threshold. The total difference may be calculated for each measured spectrum to generate a sequence of total differences, and detecting the polishing endpoint may include fitting a function to the sequence of total differences and determining a time at which the function equals the threshold.

In another aspect, a method of controlling a polishing operation includes polishing a substrate, for each zone of a plurality of zones on a substrate during polishing obtaining a sequence over time of measured spectra from the substrate with an in-situ optical monitoring system, for each measured spectrum from the sequence of measured spectra for each zone determining a difference between the measured spectrum and an immediate previous spectrum from the sequence, for each measured spectrum from the sequence of measured spectra for each zone accumulating the difference to generate a sequence of total differences, for each zone fitting a function to the sequence of total differences for the zone to generate a plurality of functions, and adjusting a polishing parameter based on the plurality of functions to provide more uniform polishing.

In another aspect, a computer program product, tangibly embodied in a machine readable non-transitory storage device, includes instructions to carry out the method.

Implementations may optionally include one or more of the following advantages. The polishing endpoint can be determined more reliably, e.g., in manufacturing environments where there are large substrate-to-substrate variations in the thickness of the underlying layer.

The details of one or more implementations are set forth in the accompanying drawings and the description below. Other aspects, features, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
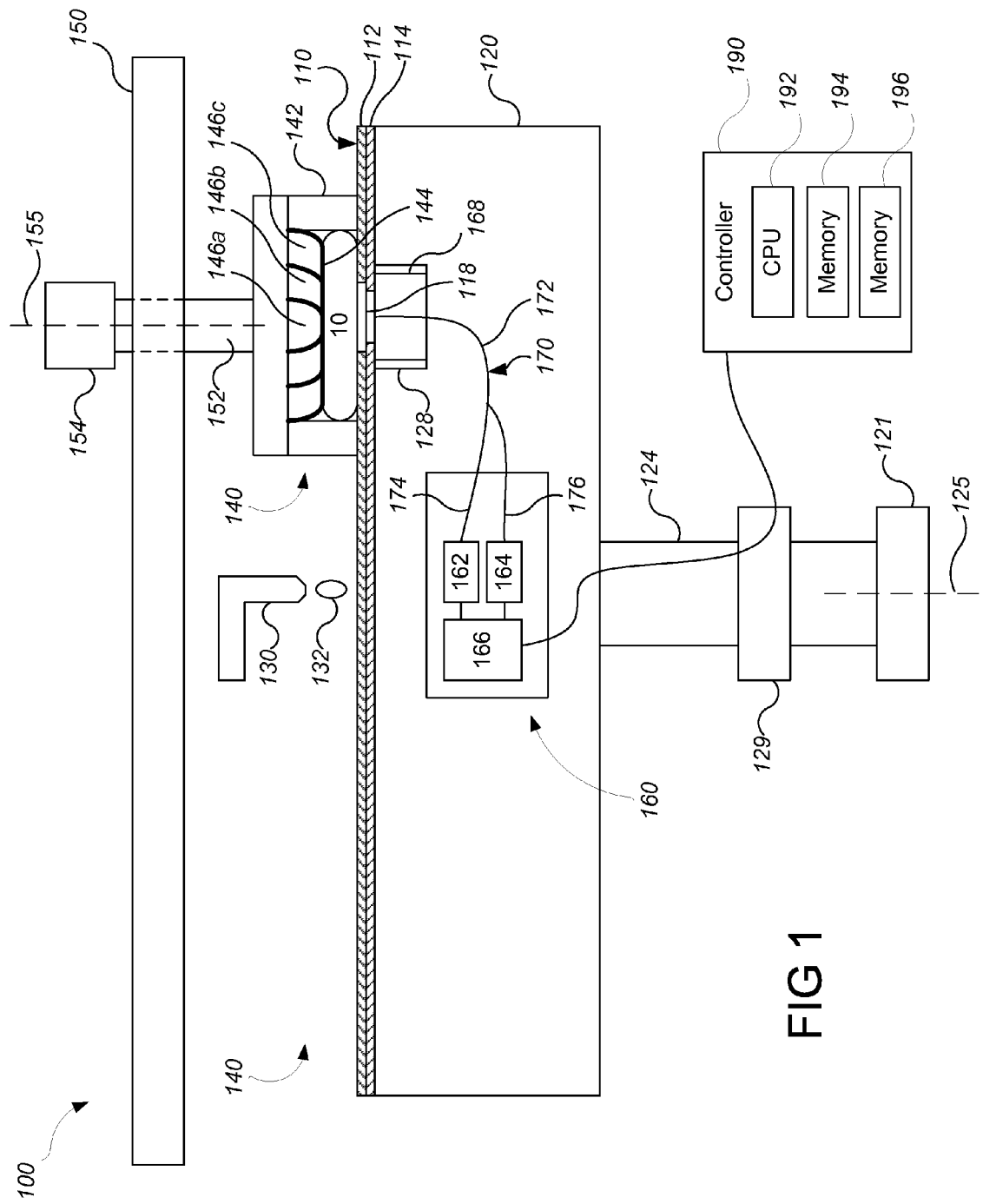
FIG. 1 illustrates a schematic cross-sectional view of an example of a polishing apparatus.

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense a polishing liquid 132, such as a slurry, onto the polishing pad 110. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. In particular, the carrier head 140 can include a retaining ring 142 to retain the substrate 10 below a flexible membrane 144. The carrier head 140 can also include a plurality of independently controllable pressurizable chambers defined by the membrane, e.g., three chambers 146a-146c, which can apply independently controllable pressurizes to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or track, and is connected by a drive shaft 152 to a carrier head rotation motor 154 so that the carrier head can rotate about an axis 155. Optionally the carrier head 140 can oscillate laterally, e.g., on sliders on the carousel or track 150; or by rotational oscillation of the carousel itself. In operation, the platen is rotated about its central axis 125, and the carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

The polishing apparatus also includes an in-situ optical monitoring system 160, e.g., a spectrographic monitoring system, which can be used for endpoint detection or to determine whether to adjust a polishing rate as discussed below. The spectrographic monitoring system can obtain a spectrum that is measured in-situ during polishing. The in-situ optical monitoring system 160 includes a probe that is supported by and rotates with the platen 120. In this case, the motion of the platen will cause the probe to scan across each substrate.

An optical access 118 through the polishing pad is provided by including an aperture (i.e., a hole that runs through the pad) or a solid window. The solid window can be secured to the polishing pad 110, e.g., as a plug that fills an aperture in the polishing pad, e.g., is molded to or adhesively secured to the polishing pad, although in some implementations the solid window can be supported on the platen 120 and project into an aperture in the polishing pad.

Figure 2:
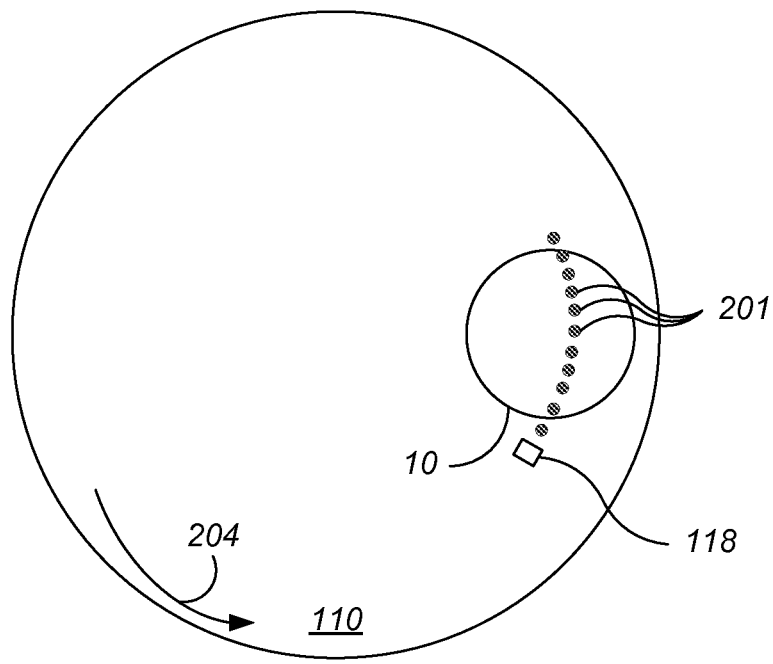
FIG. 2 illustrates a top view of a polishing pad and shows locations where in-situ measurements are taken on a first substrate.

As shown in FIG. 2, due to the rotation of the platen (shown by arrow 204), as the optical access 118 travels below the first carrier head 140, the optical monitoring system 160 can measure spectra at positions 201 below the substrate 10. This permits the optical monitoring system 160 to generate a signal with a value that depends on the thickness of the layer of the substrate 10. Over multiple rotations of the platen, for each substrate, a sequence of values can be obtained over time.

The optical monitoring system 160 can include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 can be used to transmit the light from the light source 162 to the substrate 10 and back to the detector 164. The bifurcated optical fiber an include a trunk 172 positioned in proximity to the optical access, and two branches 174 and 176 connected to the light source 162 and detector 164, respectively.

In some implementations, the top surface of the platen can include a recess 128 into which is fit an optical head 168 that holds one end of the trunk 172 of the bifurcated fiber. The optical head 168 can include a mechanism to adjust the vertical distance between the top of the trunk 172 and the solid window 118.

The output of the circuitry 166 can be a digital electronic signal that passes through a rotary coupler 129, e.g., a slip ring, in the drive shaft 124 to the controller 190 for the optical monitoring system. Similarly, the light source can be turned on or off in response to control commands in digital electronic signals that pass from the controller 190 through the rotary coupler 129 to the optical monitoring system 160. Alternatively, the circuitry 166 could communicate with the controller 190 by a wireless signal.

The light source 162 can be operable to emit visible light and/or near-infrared (NIR) light. In some implementations, the visible light emitted includes light having wavelengths of 200 to 800 nm. In some implementations, the NIR light emitted includes light having wavelengths of 0.9 to 1.7 µm.

Figure 3:
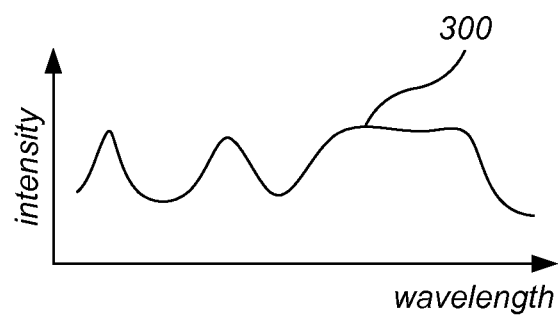
FIG. 3 illustrates a measured spectrum from the in-situ optical monitoring system.

The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency). FIG. 3 illustrates an example of a measured spectrum 300 with intensity as a function of wavelength.

As noted above, the light source 162 and light detector 164 can be connected to a computing device, e.g., the controller 190, operable to control their operation and receive their signals. The computing device can include a microprocessor situated near the polishing apparatus, e.g., a programmable computer. With respect to control, the computing device can, for example, synchronize activation of the light source with the rotation of the platen 120.

The controller 190 can include a central processing unit (CPU) 192, a memory 194, and support circuits 196, e.g., input/output circuitry, power supplies, clock circuits, cache, and the like. In addition to receiving signals from the optical monitoring system 160 (and any other endpoint detection system 180), the controller 190 can be connected to the polishing apparatus 100 to control the polishing parameters, e.g., the various rotational rates of the platen(s) and carrier head(s) and pressure(s) applied by the carrier head. The memory 194 is connected to the CPU 192. The memory 194 can be one or more readily available computer readable devices such as random access memory (RAM), read only memory (ROM), floppy disk, hard disk, or other form of digital storage. In addition, although illustrated as a single computer, the controller 190 could be a distributed system, e.g., including multiple independently operating processors and memories.

The optical monitoring system 160 is configured to generate a sequence of measured spectra at a measurement frequency. In some implementations, the light source 162 and detector 164 of the in-situ monitoring system 160 are installed in and rotate with the platen 120. In this case, the measurement frequency can be once per rotation of the platen.

It is possible for multiple raw spectra to be obtained from the optical monitoring system 160 as the optical access 118 passes below the substrate 10, in which case one of the raw spectra from the multiple spectra can be selected, or a plurality of the multiple raw spectra can be combined, e.g., averaged, to provide the measured spectra.

In operation, the controller 190 can receive, for example, a signal that carries information describing a spectrum of the light received by the light detector for a particular flash of the light source or time frame of the detector.

Without being limited to any particular theory, the spectrum of light reflected from the substrate 10 evolves as polishing progresses (e.g., over multiple rotations of the platen, not during a single scan across the substrate) due to changes in the thickness of the outermost layer, thus yielding a sequence of time-varying spectra. Moreover, particular spectra are exhibited by particular thicknesses of the layer stack.

The in-situ monitoring system is configured to generate a sequence of measured spectra. In some implementations, the controller 190, e.g., the computing device, can be programmed to generate one measured spectrum per scan of the optical access 118 below the substrate, e.g., once per rotation of the platen.

In some situations, the "raw" spectra obtained by the in-situ monitoring system can be subjected to various processing to generate a measured spectrum. For example, the "raw" spectra can be normalized. In addition, if the in-situ monitoring system generates multiple raw spectra from a single scan of across the substrate (e.g., as shown in FIG. 2), at least some of the raw spectra can be combined to generate the measured spectrum.

In one implementation, the raw spectra collected from a scan of the optical access 118 across the substrate can be averaged to generate the measured spectrum. Alternatively, a raw spectrum can be selected from the multiple raw spectra from a scan to provide the measured spectrum. In addition, spectra collected from a preset number of scans, e.g., two to five scans, of the optical access 118 across the substrate can be averaged to generate the measured spectrum.

For each measured spectrum in the sequence, a difference is calculated between that measured spectrum and the immediately previous measured spectrum in the sequence. The difference can be calculated using a sum-of-squared difference over a wavelength range between the measured spectrum and the previous spectrum.

For example, where a measured spectrum is represented by $S(\lambda)$, for the $K^{th}$ spectrum in the sequence (with K>1), the difference $\Delta_K$ can be calculated as $$\Delta_K = \frac{1}{L} \sum_{\lambda=min}^{\lambda=max} \sqrt{(S_K(\lambda)^2 - S_{K-1}(\lambda)^2}$$

where min and max are lower limit and upper limit of the wavelength range, respectively, and L is the total number of intensity values in the wavelength range.

Alternatively, the difference could be calculated using a sum of absolute differences.

As polishing progresses, the differences between the measured spectrum and the immediately previous measured spectrum are accumulated, e.g., summed, to generate a total difference.

For example, for the Nth spectrum in the sequence, the total difference $\Delta_{TOTAL}$ can be calculated as $$\Delta_{TOTAL} = \Sigma_{i=1}^{N} \Delta_i$$

The total difference can be compared to a threshold value. When the total difference equals or exceeds the threshold value then an endpoint is called and polishing is halted. A threshold value that provides the desired amount of polishing can be determined empirically through polishing and measurement of test substrates. The polishing endpoint can be determined more reliably, e.g., in manufacturing environments where there are large substrate-to-substrate variations in the thickness of the underlying layer.

Figure 4:
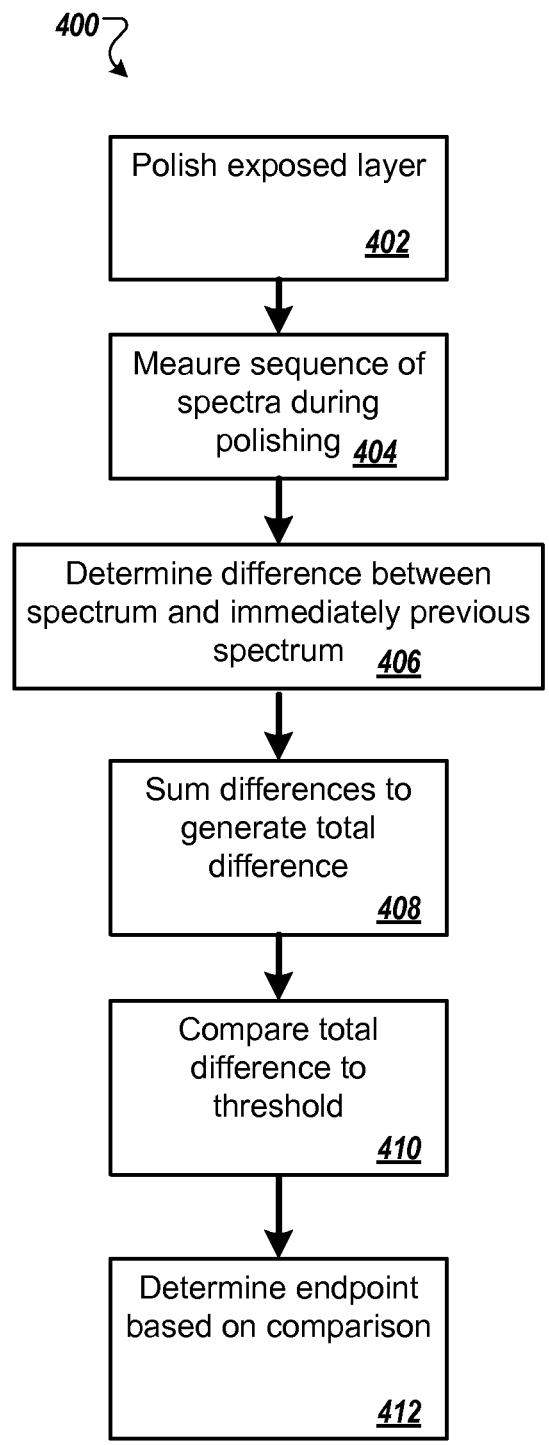
FIG. 4 is a flow diagram of an example process for controlling a polishing operation.

FIG. 4 shows a flow chart of a method 400 of polishing a product substrate. The product substrate can have at least the same layer structure as what is represented in the optical model.

The product substrate is polished (step 402), and a sequence of measured spectra are obtained during polishing (step 404), e.g., using the in-situ monitoring system described above. There may be a variety of preliminary polishing steps prior to obtaining the sequence of measured spectra. For example, one or more overlying layers can be removed, e.g., a conductive layer or dielectric layer, and measuring of the spectra can be triggered when removal of an overlying layer. In addition, the "raw" spectra obtained by the in-situ monitoring system can be subjected to various processing to generate a measured spectrum. For example, the "raw" spectra can be normalized, or multiple raw spectra from a single scan of across the substrate can be combined, e.g., averaged.

For each measured spectrum in the sequence, the difference between the spectrum and an immediately previous measured spectrum in the sequence can be determined (step 406). For example, the difference can be determined using a sum of squared differences, or a sum of absolute differences, although other techniques are possible. As polishing progresses, the differences are accumulated, e.g., summed, to calculate a total difference as polishing progresses (step 408). The total difference is compared to a threshold (step 410), and an endpoint is determined based on the comparison (step 412), e.g., if the total difference equals or exceeds the threshold then the endpoint is called and polishing is halted.

In some implementations, rather than directly comparing the total difference to the threshold, a sequence of total difference values is generated, e.g., one total difference value per measured spectrum. A function can be fit to the sequence of total difference values, and the time at which the function will equal the threshold can be calculated.

The calculation of the difference need not start immediately following polishing, but can be initiated at a predetermined time after polishing begins. This can permit the total difference to be calculated without initial noise in the spectra that tend to occur at the beginning of polishing. In addition, calculation of the difference could be triggered by another monitoring system, e.g., after a reflectivity or motor current monitoring system indicates that a layer of a multilayer substrate has been exposed.

It is possible to generate a sequence of total difference values for different zones of the substrate, and use the sequences from different zones to adjust the pressure applied in the chambers of the carrier head to provide more uniform polishing, e.g., using techniques described in U.S. application Ser. No. 13/096,777, incorporated herein by reference (in general, the total difference value can be substituted for the index value to use similar techniques). In some implementations, the sequence of total difference values is used to adjust the polishing rate of one or more zones of a substrate, but another in-situ monitoring system or technique is used to detect the polishing endpoint.

In addition, although the discussion above assumes a rotating platen with an optical endpoint monitor installed in the platen, the system could be applicable to other types of relative motion between the monitoring system and the substrate. For example, in some implementations, e.g., orbital motion, the light source traverses different positions on the substrate, but does not cross the edge of the substrate. In such cases, measured spectra can be collected at a certain frequency, e.g., 1 Hz or more. Again, if the in-situ monitoring system generates raw spectra at a higher frequency than the certain frequency, then a plurality of raw spectra can be combined or a raw spectrum can be selected from the plurality to generate a measured spectrum.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a non-transitory machine readable storage media, for execution by, or to control the operation of, data processing apparatus, e.g., a programmable processor, a computer, or multiple processors or computers.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims.

What is claimed is:

1. A method of controlling a polishing operation, comprising:
   polishing a substrate;
   during polishing, obtaining a sequence over time of measured spectra from the substrate with an in-situ optical monitoring system;
   for each measured spectrum from the sequence of measured spectra, determining a difference between the measured spectrum and an immediate previous spectrum from the sequence;
   accumulating the difference for each measured spectrum to generate a total difference;
   comparing the total difference to a threshold; and
   detecting a polishing endpoint based on the comparison of the total difference to the threshold.

2. The method of claim 1, wherein obtaining the sequence comprises scanning a sensor of the optical monitoring system across the substrate.

3. The method of claim 2, wherein obtaining the sequence comprises generating one measured spectrum per scan of the sensor across the substrate.

4. The method of claim 3, wherein polishing the substrate comprises rotating a platen that supports the sensor, and one measured spectrum is generated per rotation of the platen.

5. The method of claim 3, wherein the in-situ monitoring system generates a plurality of raw spectra per scan of the sensor across the substrate.

6. The method of claim 5, wherein generating the one measured spectrum per scan comprises combining at least some of the plurality of raw spectra.

7. The method of claim 6, wherein combining at least some of the plurality of raw spectra comprises averaging the at least some of the plurality of raw spectra.

8. The method of claim 5, wherein generating the one measured spectrum per scan comprises selecting a raw spectrum from at least some of the plurality of raw spectra.

9. The method of claim 1, wherein determining the difference comprises calculating a sum of squared differences between the measured spectrum and the immediate previous spectrum.

10. The method of claim 1, wherein determining the difference comprises calculating a sum of absolute differences between the measured spectrum and the immediate previous spectrum.

11. The method of claim 1, wherein obtaining the sequence of measured spectra comprises directing a beam of light onto the substrate and measuring a spectrum of a reflection of the beam.

12. The method of claim 1, wherein accumulating the difference comprising summing the difference.

13. The method of claim 1, wherein detecting the polishing endpoint comprises halting polishing if the total difference exceeds the threshold.

14. The method of claim 1, wherein the total difference is calculated for each measured spectrum to generate a sequence of total differences, and wherein detecting the polishing endpoint includes fitting a function to the sequence of total differences and determining a time at which the function equals the threshold.

15. A method of controlling a polishing operation, comprising:
- polishing a substrate;
- during polishing, for each zone of a plurality of zones on a substrate, obtaining a sequence over time of measured spectra from the substrate with an in-situ optical monitoring system;
- for each measured spectrum from the sequence of measured spectra for each zone, determining a difference between the measured spectrum and an immediate previous spectrum from the sequence;
- for each measured spectrum from the sequence of measured spectra for each zone, accumulating the difference to generate a sequence of total differences;
- for each zone fitting a function to the sequence of total differences for the zone to generate a plurality of functions; and
- adjusting a polishing parameter based on the plurality of functions to provide more uniform polishing.

* * * * *